(12) United States Patent
Minamide et al.

(10) Patent No.: US 6,171,761 B1
(45) Date of Patent: Jan. 9, 2001

(54) RESIST PATTERN FORMING METHOD UTILIZING MULTIPLE BAKING AND PARTIAL DEVELOPMENT STEPS

(75) Inventors: Ayumi Minamide; Takeo Ishibashi, both of Hyogo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/231,627

(22) Filed: Jan. 15, 1999

(30) Foreign Application Priority Data

Jul. 15, 1998 (JP) .................................................. 10-200567

(51) Int. Cl.[7] ....................................................... G03C 5/00
(52) U.S. Cl. ......................... 430/313; 430/323; 430/330; 430/331
(58) Field of Search .................................... 430/313, 322, 430/323, 330, 331

(56) References Cited

U.S. PATENT DOCUMENTS 5,223,377 * 6/1993 Samarakone et al. ............... 430/330
5,707,784 * 1/1998 Oikawa et al. ...................... 430/330
5,876,897 * 3/1999 Durham et al. ..................... 430/330
5,968,713 * 10/1999 Nozaki et al. ...................... 430/330

FOREIGN PATENT DOCUMENTS 6-342214 * 12/1994 (JP) .

* cited by examiner

*Primary Examiner*—Christopher G. Young
(74) *Attorney, Agent, or Firm*—McDermott, Will & Emery

(57) ABSTRACT

An improved method of forming a resist pattern permitting control of a resist profile of a chemically amplified-type resist is provided. A chemically amplified-type resist is exposed to light using a mask. The resist is then baked by PEB at a first temperature, and developed halfway. The resist is baked again at a second temperature lower than the first temperature, and then fully developed. A resist pattern is thus obtained.

26 Claims, 10 Drawing Sheets

RESIST PATTERN FORMING METHOD UTILIZING MULTIPLE BAKING AND PARTIAL DEVELOPMENT STEPS

BACKGROUND OF THE INVENTION

1. Field of the Invention

The present invention generally relates to a method of forming a resist pattern, and more particularly to an improved method of forming a resist pattern permitting control of a resist profile of a chemically amplified-type resist. The present invention also relates to a method of forming semiconductor device using the resist pattern.

2. Description of the Background Art

In the field of photolithography, a chemically amplified-type resist is currently proposed as a resist having high sensitivity as well as high resolution. This resist has a feature that it is baked after exposure to light, and this post exposure bake (hereinafter referred to as "PEB") accelerates pattern forming reaction with an acid generated during the exposure as a catalyst, and thus pattern imaging is completed.

FIGS. 15–18 are cross sectional views of a semiconductor device at successive steps of a conventional method of forming a fine resist pattern using a chemically amplified-type resist.

Referring to FIG. 15, a substrate 1 is coated with a chemically amplified-type resist 2. Note that the surface of substrate 1 has been processed with HMDS (hexamethyldisilane) or the like before coating with the resist, to ensure close contact between substrate 1 and resist 2.

Resist 2 is formed of poly (p-t-butyl oxy-carbonyl oxy-styrene) with t-butyl oxy-carbonyl (hereinafter referred to as "t-BOC") coupled to poly-phydroxy styrene, as shown, for example, in FIG. 19A. This composition is only by way of example, and other compositions may also be used. In FIG. 19A, n is a natural number representing a degree of polymerization. Resist 12 includes an acid generating agent, i.e., triphenyl sulfonium trifluoro methane sulfonate, as shown in FIG. 19B.

Once substrate 1 has been coated with resist 2, it is pre-baked to remove a solvent or the like included in resist 2.

An acid film 3 is formed on resist 2, which is made, for example, of water-soluble polymer such as polyvinylpyrrolidone or polyacrylic acid. Acid film 3 selves for preventing intra-film multiple reflections. Another function expected of the film here will be described later. Thereafter, baking is conducted again to remove a solvent in acid film 3.

With reference to FIG. 16, resist 2 is selectively exposed to light using a mask 4, to form an exposed portion 5 and an unexposed portion 6.

At the exposed portion, the acid generating agent is irradiated with light, and thus generates a protonic acid, as shown in FIG. 20.

Referring to FIG. 17, resist 2 is subjected to PEB. At this time, the protonic acid causes t-BOC groups to leave from poly (p-t-butyl oxy-carbonyl oxy-styrene), so that hydroxyl groups (phenol groups) are generated. Thus generated poly-p-hydroxy styrene is soluble in alkali.

Next, how the t-BOC groups leave from the base resin will be described in more detail with reference to FIG. 22.

With reference to FIG. 22(a), resist 2 is irradiated with light. Accordingly, the acid generating agent in the resist decomposes to generate a protonic acid ($H^+$) (see FIG. 22(b)). As shown in FIG. 22(c), subsequent baking of resist 2 causes the t-BOC groups to leave from poly (p-t-butyl oxy-carbonyl oxy-styrene), thereby generating hydroxyl groups. As the baking is continued, more t-BOC groups are generated (FIG. 22 (d)). Ultimately, as seen in FIG. 22(e), the base resin is converted to polyvinylphenol, that is soluble in an alkaline developer solution.

Generally, a chemically amplified-type resist is susceptible to acid and base existing within the resist or entering from the outside. An acid film 3 is thus formed on the resist 2 as a protective film. Since this protective film is an acid film, however, acid is fed from acid film 3 to the surface of resist 2 at the unexposed portion 6. The reference numeral 7 in FIG. 17 shows a portion which has been supplied with the acid and thus become soluble in alkali.

With reference to FIG. 18, when developed with an alkaline solution with 2.38% tetramethylammonium hydroxide (TMAH) 2, the alkali-soluble portion is removed to form a fine resist pattern. Using this resist pattern, a bit line or the like is patterned.

As described above, in a conventional method of forming a fine resist pattern using a chemically amplified-type resist, acid is supplied from acid film 3 to resist 2 even at the unexposed portion, as shown in FIGS. 17 and 18. Accordingly, resist pattern 8 obtained after the development has a rounded top portion. That is, a rectangular resist profile can not be attained as desired.

If acid film 3 is not formed on resist 2, amine (ammonia etc.) will penetrate into resist 2 from the outside, and as shown in FIG. 23, the top portion of resist pattern 8 will expand in the horizontal direction, resulting in a so-called T-shaped resist pattern. Either in this case, a desirable, rectangular resist cannot be attained.

SUMMARY OF THE INVENTION

The present invention is made to solve the above-described problems. One of its objects is to provide an improved method of forming a resist pattern allowing a rectangular resist profile to be obtained as desired.

Another object of the invention is to provide an improved resist pattern forming method capable of avoiding an adverse effect of amine from the outside.

A further object of the invention is to provide an improved resist pattern forming method permitting control of a resist profile of a chemically amplified-type resist.

A still further object of the invention is to provide an improved resist pattern forming method allowing a desirable resist profile to be obtained even when rays of light are defocused and some of them undesirably enter the unexposed portion of the resist from its periphery.

A still further object of the invention is to provide an improved method of forming a semiconductor device.

In the resist pattern forming method according to a first aspect of the present invention, a chemically amplified-type resist is first formed on a substrate, and is exposed to light using a mask. After the exposure, the resist is baked at a first temperature, and then developed halfway. The resist developed halfway is then baked at a second temperature which is lower than the first temperature. Thereafter, it is fully developed and a resist pattern is obtained.

According to this aspect, the resist is not fully developed at the first developing step, and an alkali-insoluble layer with acid inactivated by alkali is thus formed on the surface of the resist pattern at the unexposed portion. The second developing step is conducted thereafter. Accordingly, a rectangular resist pattern can be obtained as desired.

In the resist pattern forming method according to a second aspect, a positive resist is employed as a chemically amplified-type resist, and thus a positive resist pattern is obtained.

In the method according to a third aspect, the first temperature is set in the range of 30 to 150° C. The post exposure bake at a temperature in this range allows an acid generating agent in the exposed portion to generate acid smooth.

In the method according to a fourth aspect, the difference between the first and second temperatures is set to be 10° C. or larger. This prevents an alkali-insoluble portion formed on the surface of the resist pattern at the unexposed portion from dissolving into an alkaline developer solution.

In the method according to a fifth aspect, the step of developing the resist halfway is performed until 10 to 80% of the resist at the exposed portion is removed. In other words, the first developing step is performed incompletely.

In the method according to a sixth aspect, an acid film is formed on the chemically amplified-type resist prior to the exposure. This prevents penetration of amine from the outside into the resist.

In the method according to a seventh aspect, the resist pattern is adapted to form an interconnection pattern of 0.20–0.22 $\mu$m L/S (Line and Space). Accordingly, the present invention is especially effective when forming a fine resist pattern.

In the method of forming a resist pattern according to an eighth aspect, a chemically amplified-type resist is first formed on a substrate, and an acid film is formed on the resist. Using a mask, the resist is exposed. The acid film is removed with water. The resist is baked, and then developed.

According to this aspect, the acid film is removed prior to the post exposure bake of the resist, and therefore, acid is not supplied to the resist at the unexposed portion. This ensures that a rectangular resist pattern is obtained as desired.

In the method according to a ninth aspect, the step of removing the acid film with water includes the step of supplying water to the acid film while rotating the substrate. Such rotation of the substrate when supplying water ensures uniform removal of the acid film.

In the method according to a tenth aspect, the acid film is formed, for example, of water-soluble polymer such as polyvinylpyrrolidone or polyacrylic acid. Accordingly, the acid film can be formed with a readily available material.

In the method of forming a semiconductor device according to eleventh aspect of the present invention, a layer to be patterned is formed on a substrate. A chemically amplified-type resist is first formed on a substrate, and is exposed to light using a mask. After the exposure, the resist is baked at a first temperature, and then developed halfway. The resist developed halfway is then baked at a second temperature which is lower than the first temperature. Thereafter, it is fully developed and a resist pattern is obtained. Using the resist pattern as a mask, the layer is etched.

In the method of forming a semiconductor device according to twelfth aspect of the present invention, a layer to be patterned is formed on a substrate. A chemically amplified-type resist is formed on the substrate. An acid film is formed on the resist. The resist is exposed using a mask. The acid film is removed with water. The resist is baked before development. The resist is developed to obtain a resist pattern. The layer is etched using the resist pattern as a mask.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to drawings.

First Embodiment

FIGS. 1–5 are cross sectional views of a semiconductor device illustrating a resist pattern forming method according to the first embodiment of the present invention.

Figure 1:
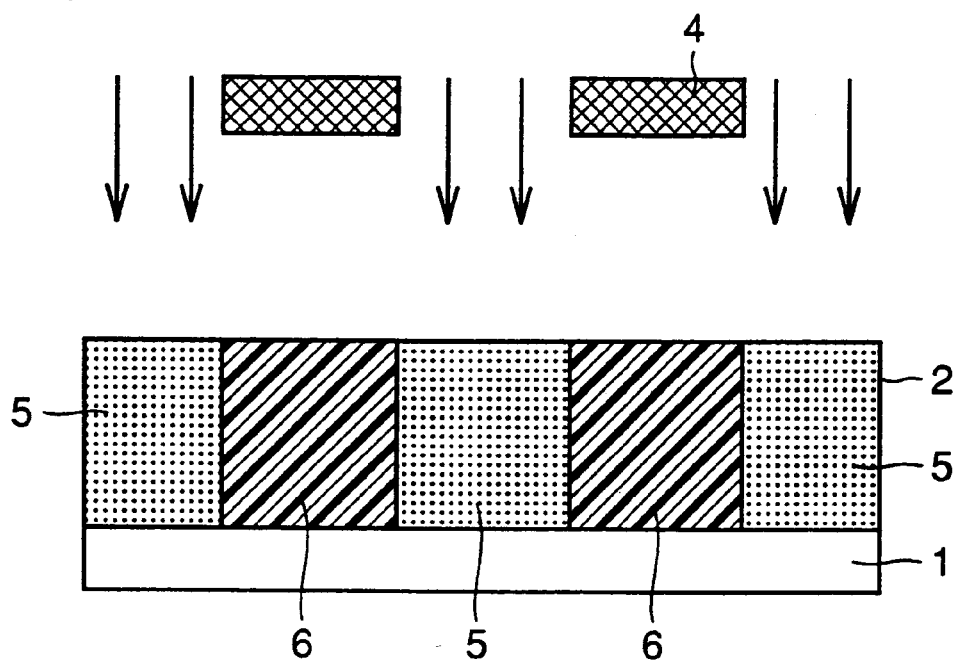
FIGS. 1–5 are cross sectional views of a semiconductor device at first through fifth steps of a method of forming a resist pattern according to a first embodiment of the present invention.

With reference to FIG. 1, a substrate (wafer) 1, which has a layer to be patterned thereon, is coated with a positive type, chemically amplified-type resist 2 by spin-coating. To remove a solvent in resist 2, it is pre-baked at 90° C. for 60 seconds. Resist 2 is then exposed to light, such as Hg lamp i-line, KrF excimer laser, or ArF excimer laser, using a mask 4. Accordingly, an exposed portion 5 and an unexposed portion 6 are formed in resist film 2.

Figure 2:
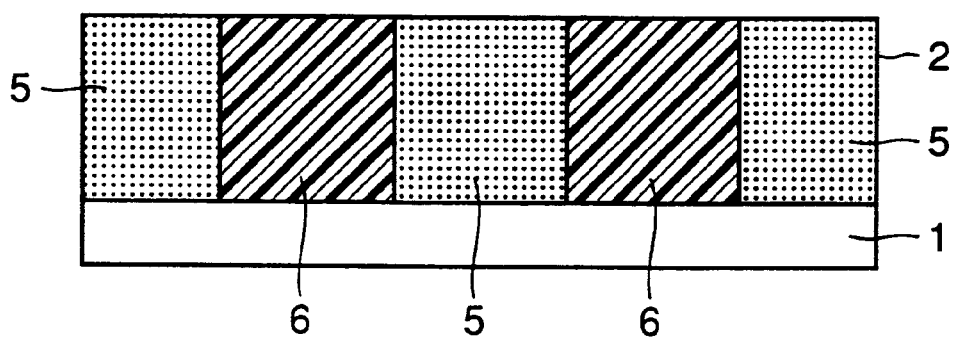

Referring to FIG. 2, resist 2 is subjected to the PEB at 100° C., thereby thermally causing acid to generate from an acid generating agent. An alkali-soluble portion is thus formed in resist 2, in which dissociation of t-Boc groups is advanced.

Figure 3:
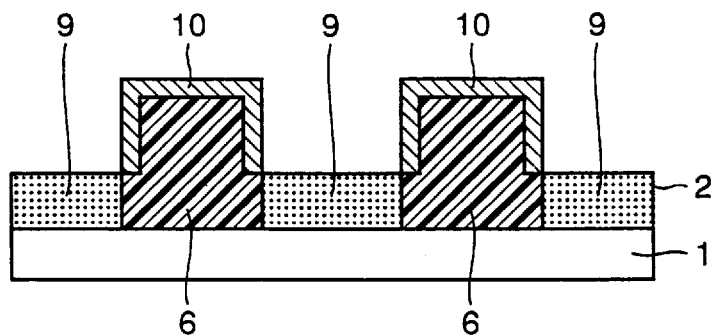

With reference to FIG. 3, the alkali-soluble portion 9 is developed for a prescribed amount, with an alkaline solution containing 2.38% TMAH for 5 seconds. This prescribed amount to be developed is set equal to 10 to 80% of the resist at the exposed portion. By the first development, an alkali-insoluble layer 10 with acid inactivated by alkali is formed at the unexposed portion. That is, even if the portion which was supposed to be the unexposed portion 6 is exposed to rays of light entering from its periphery and acid is thus generated therein, the layer 10 formed at this portion remains insoluble in alkali. Note that this undesirable entering of rays of light tends to occur at the time of defocus.

Figure 4:
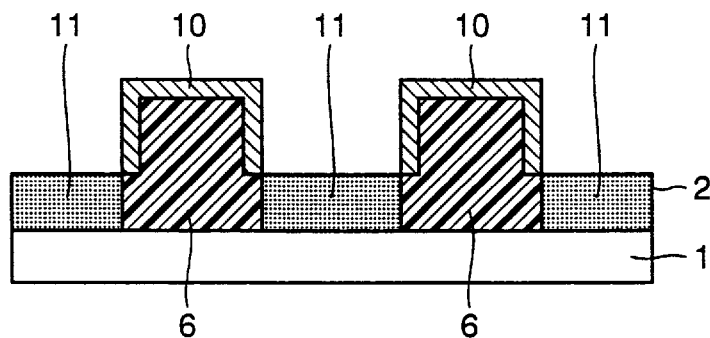

With reference to FIG. 4, baking is conducted at 85° C. for 60 seconds to cause further diffusion of the acid at the portion which has been subjected to the first development, thereby forming a layer 11 more soluble in alkali. The temperature at this time can be lowered by 10° C. or more with respect to the temperature at PEB, which can prevent reactivation of the acid within the acid-inactivated portion.

Figure 5:
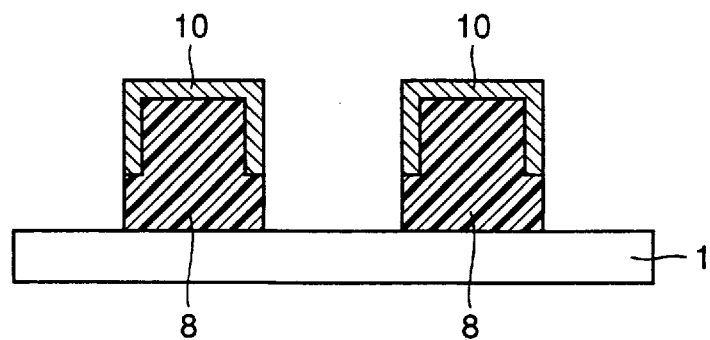

With reference to FIGS. 4 and 5, development is conducted again with the alkaline solution containing 2.38% TMAH for 40 seconds. Thereafter, normal post baking is conducted to form a 64 MDRAM third generation resist pattern 8. In this manner, the resist pattern is formed with 0.22 μm L/S.

Thus obtained resist pattern is superior in its rectangular shape to the pattern which has been obtained from the same resist but with a conventional method (i.e., coating with a resist→pre-bake→exposure to light→PEB→development for 60 seconds→and post-bake).

The layer formed on the substrate 1 is etched using the resist pattern as a mask.

Second Embodiment

FIGS. 6–10 are cross sectional views of a semiconductor device illustrating a resist pattern forming method according to the second embodiment. This embodiment is a variation of the first embodiment.

Figure 6:
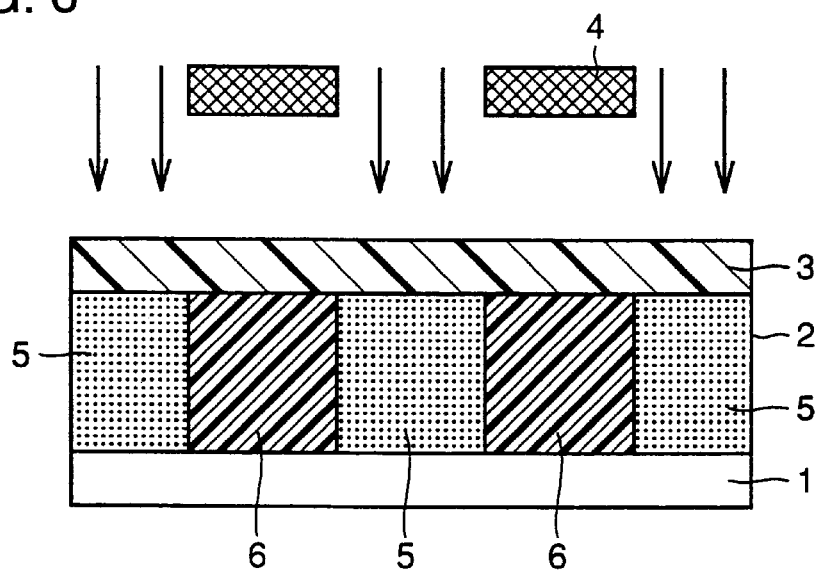
FIGS. 6–10 are cross sectional views of a semiconductor device at first through fifth steps of a resist pattern forming method according to a second embodiment.

With reference to FIG. 6, a substrate 1 is coated with a resist 2 by spin-coating. It is then pre-baked at 90° C. for 60 seconds. An acid film 3 is formed on resist 2, which is made of polyvinyl alcohol, for example. Baking is further conducted to remove a solvent in acid film 3. Thereafter, resist 2 is exposed to light using a mask 4, thereby forming an exposed portion 5 and an unexposed portion 6.

Figure 7:
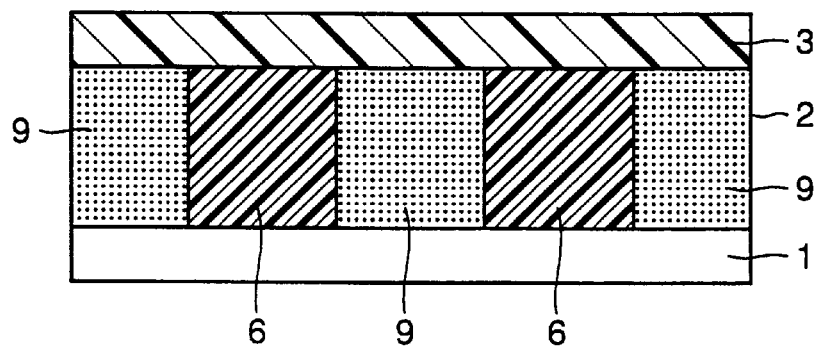

With reference to FIGS. 6 and 7, further exposure to light at 100° C. for 60 seconds results in an alkali-soluble portion 9 to be formed at the exposed portion, in which t-BOC groups are dissociated.

Figure 8:
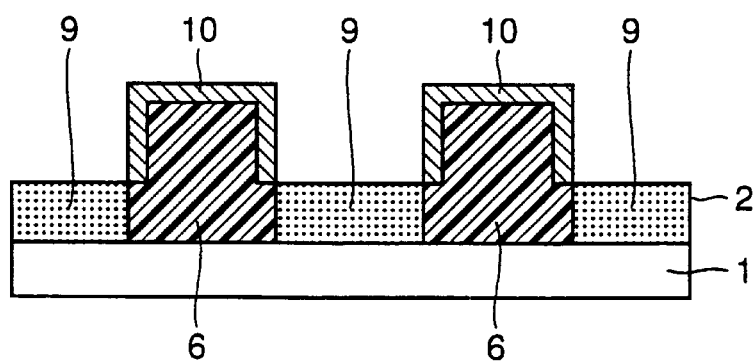

Referring to FIGS. 7 and 8, alkali-soluble portion 9 is developed for a prescribed amount with the alkaline solution containing 2.38% TMAH for 5 seconds. Acid film 3 is also removed at this time. By this development, an alkali-insoluble layer 10 with acid inactivated by alkali is formed at the unexposed portion.

Figure 9:
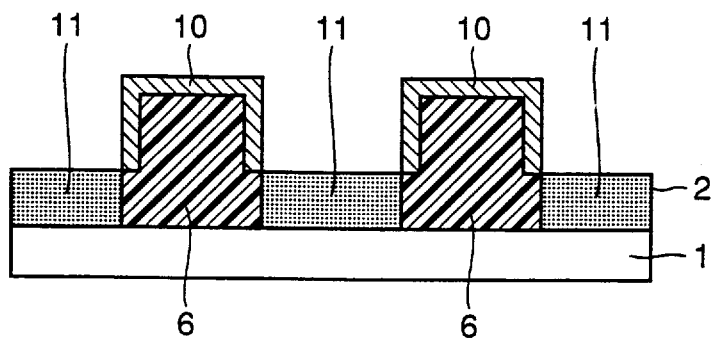

With reference to FIG. 9, the acid is further diffused in alkali-soluble portion 9 by baking the same at 85° C. for 60 seconds, and a layer 11 further soluble in alkali is thus formed.

Figure 10:
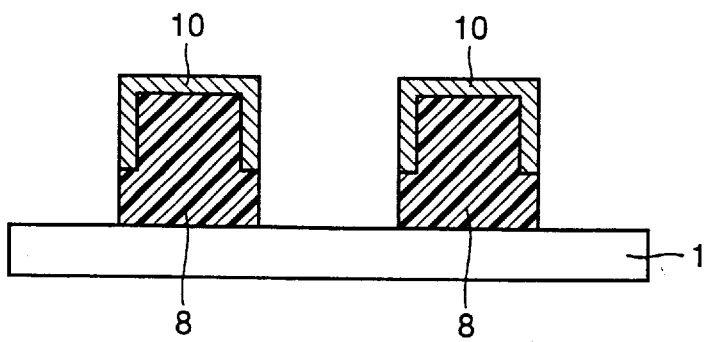

Referring to FIG. 10, further development with the alkaline solution containing 2.38% TMAH is performed for 40 seconds, thereby completing development. Thereafter, normal post baking is conducted to obtain a pattern of 0.22 μm L/S. The layer formed on the substrate 1 is etched using the resist pattern as a mask.

Third Embodiment

FIGS. 11–14 are cross sectional views of a semiconductor device illustrating a resist pattern forming method according to the third embodiment.

Figure 11:
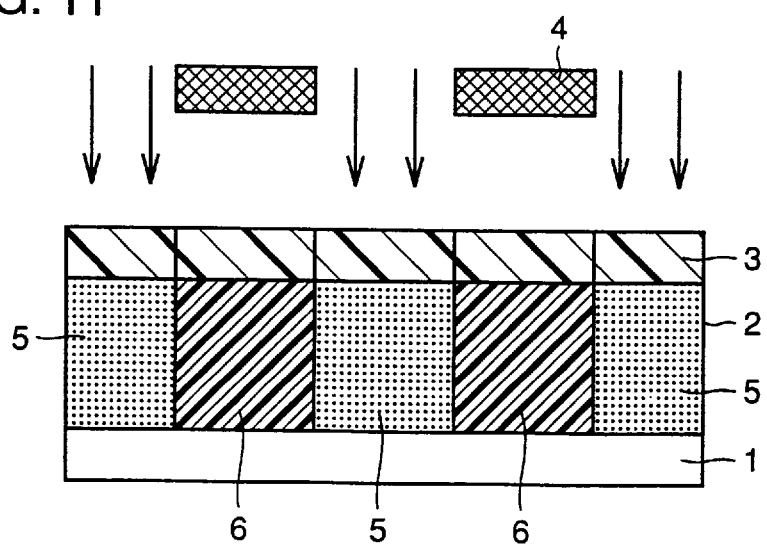
FIGS. 11–14 are cross sectional views of a semiconductor device at first through fourth steps of a resist pattern forming method according to a third embodiment.

With reference to FIG. 11, a substrate 1 is coated with a chemically amplified-type resist 2 with a thickness of 0.88 μm. It is then pre-baked at 90° C. for 60 seconds to remove a solvent in resist 2. Resist 2 is coated with a water-soluble acid film 3 with a thickness of 430 Å. Thereafter, low-temperature baking is conducted at 60° C. for 60 seconds to remove a solvent in acid film 3.

Thereafter, using a mask 4, resist 2 is exposed to light having a wavelength of 248 nm.

Figure 12:
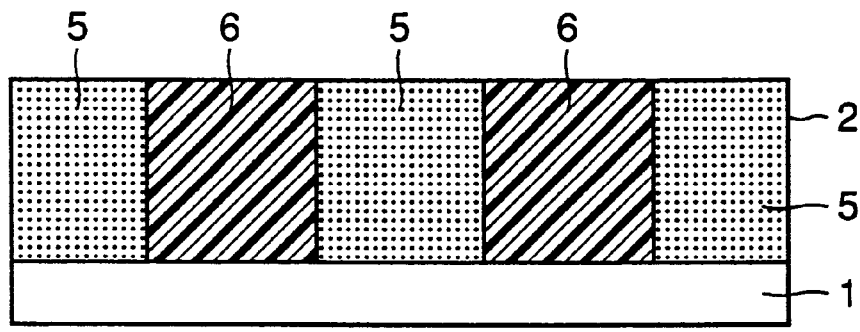

Referring to FIGS. 11 and 12, pure water is supplied, while rotating substrate 1, to acid film 3 to clean and remove the same.

Figure 13:
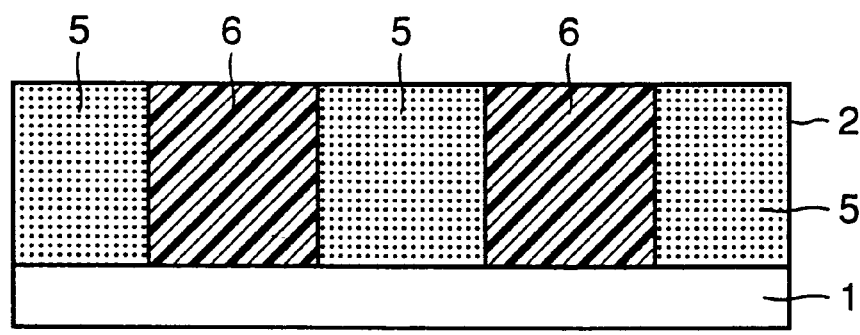

Referring to FIG. 13, resist 2 is subjected to PEB at 110° C. for 60 seconds.

Figure 14:
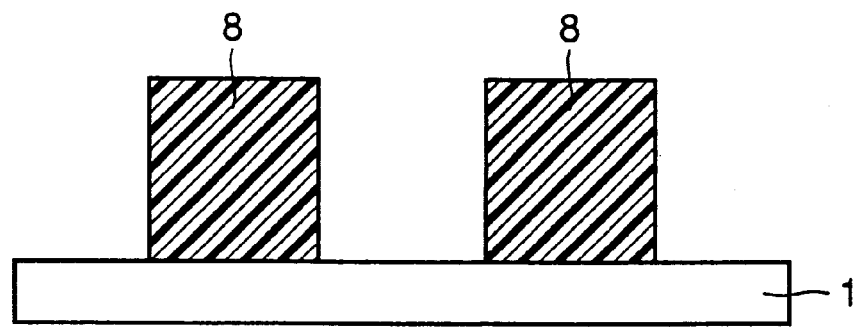
Figure 15:
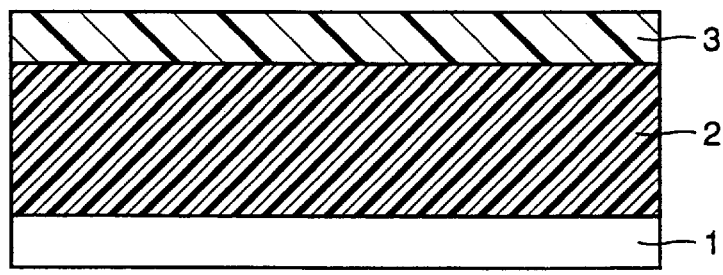
FIGS. 15–18 are cross sectional views of a semiconductor device at first through fourth steps of a conventional resist pattern forming method.
Figure 16:
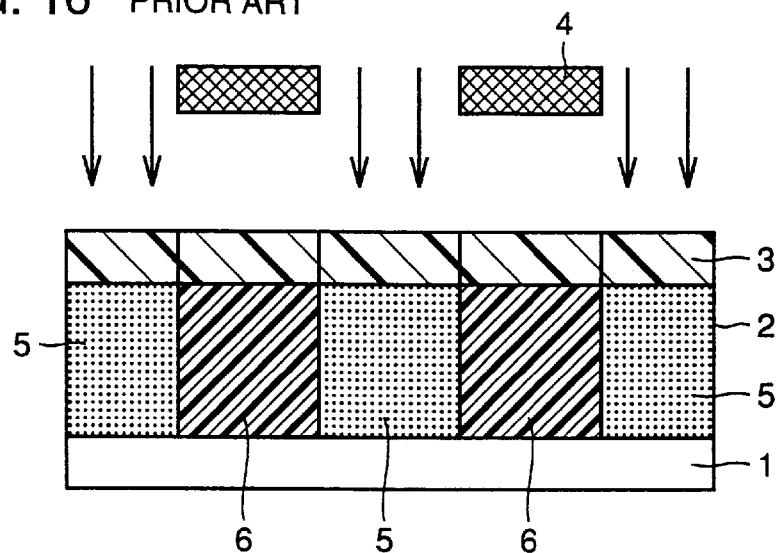
Figure 17:
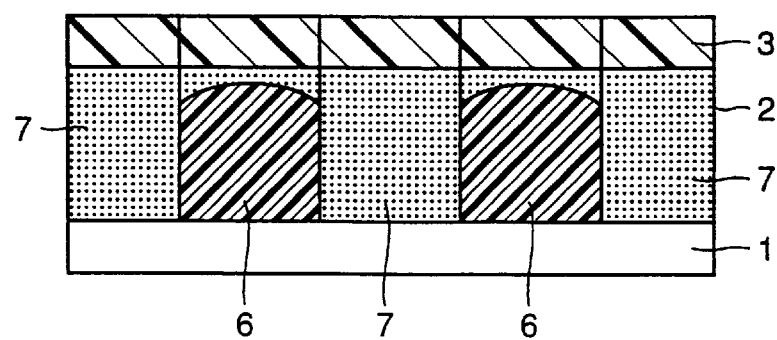
Figure 18:
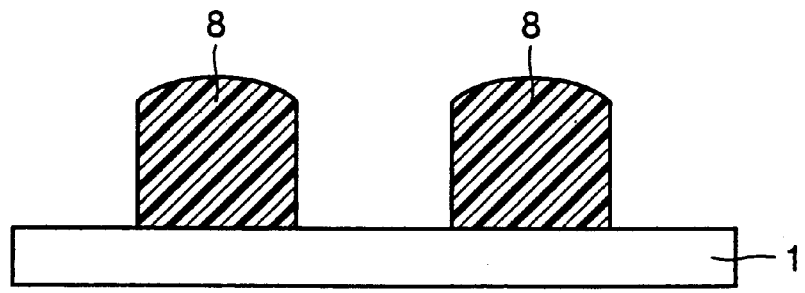
Figure 19A:
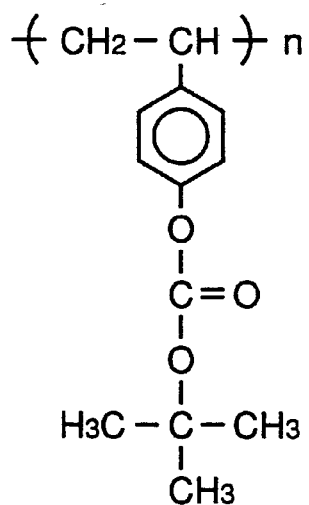
FIG. 19A is a chemical structural formula of a base resin included in a conventional positive type, chemically amplified-type resist.
Figure 19B:
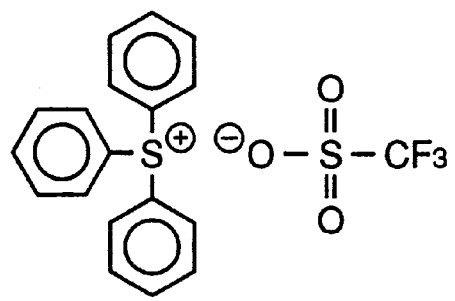
FIG. 19B is a chemical formula of an acid generating agent.
Figure 20:
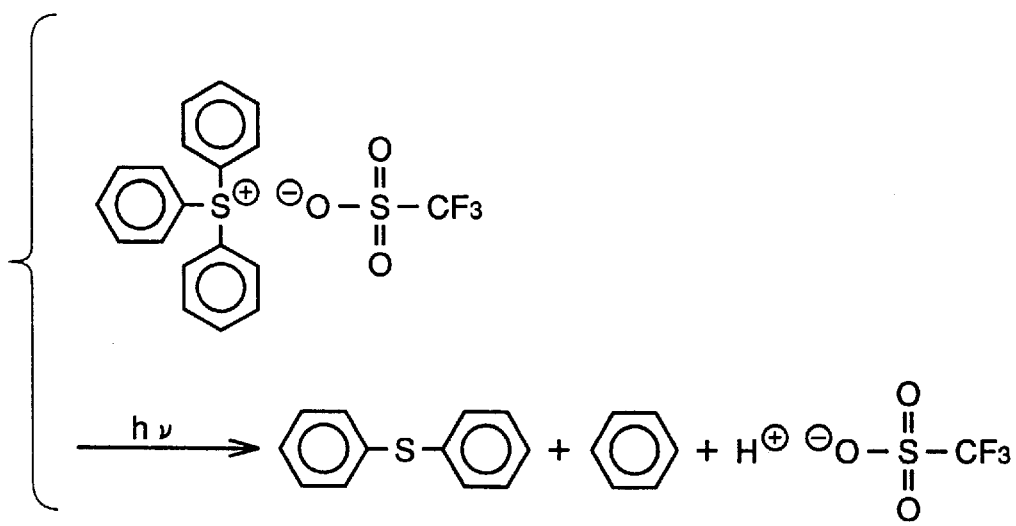
FIG. 20 is a chemical reaction formula illustrating photo-decomposition of the acid generating agent.
Figure 21:
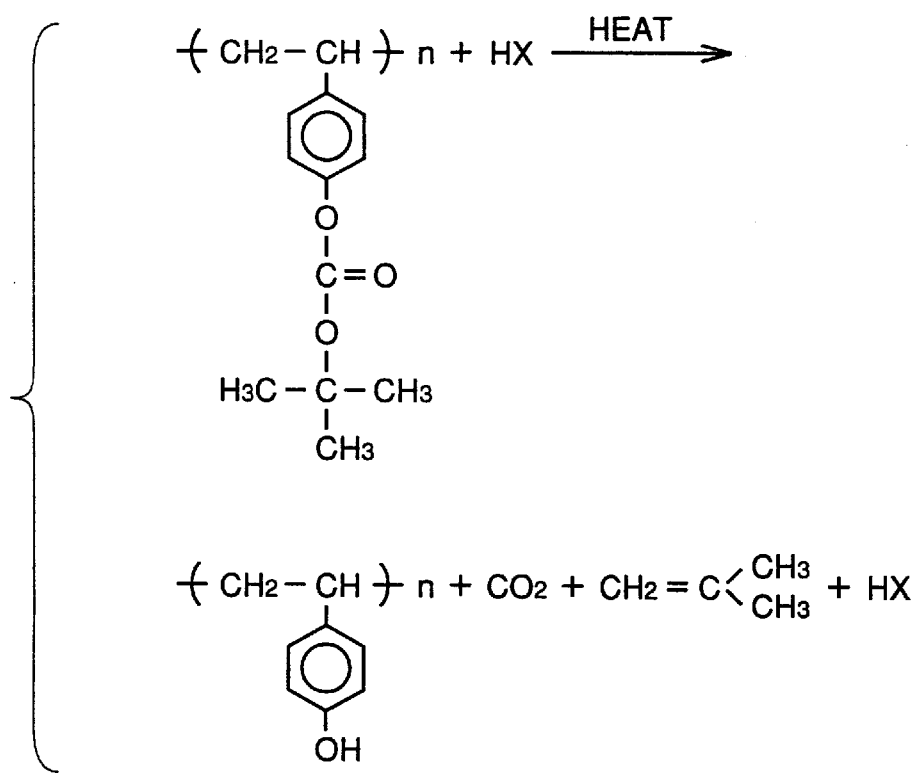
FIG. 21 is a chemical formula illustrating a principle as to how the exposed portion becomes alkali-soluble.
Figure 22:
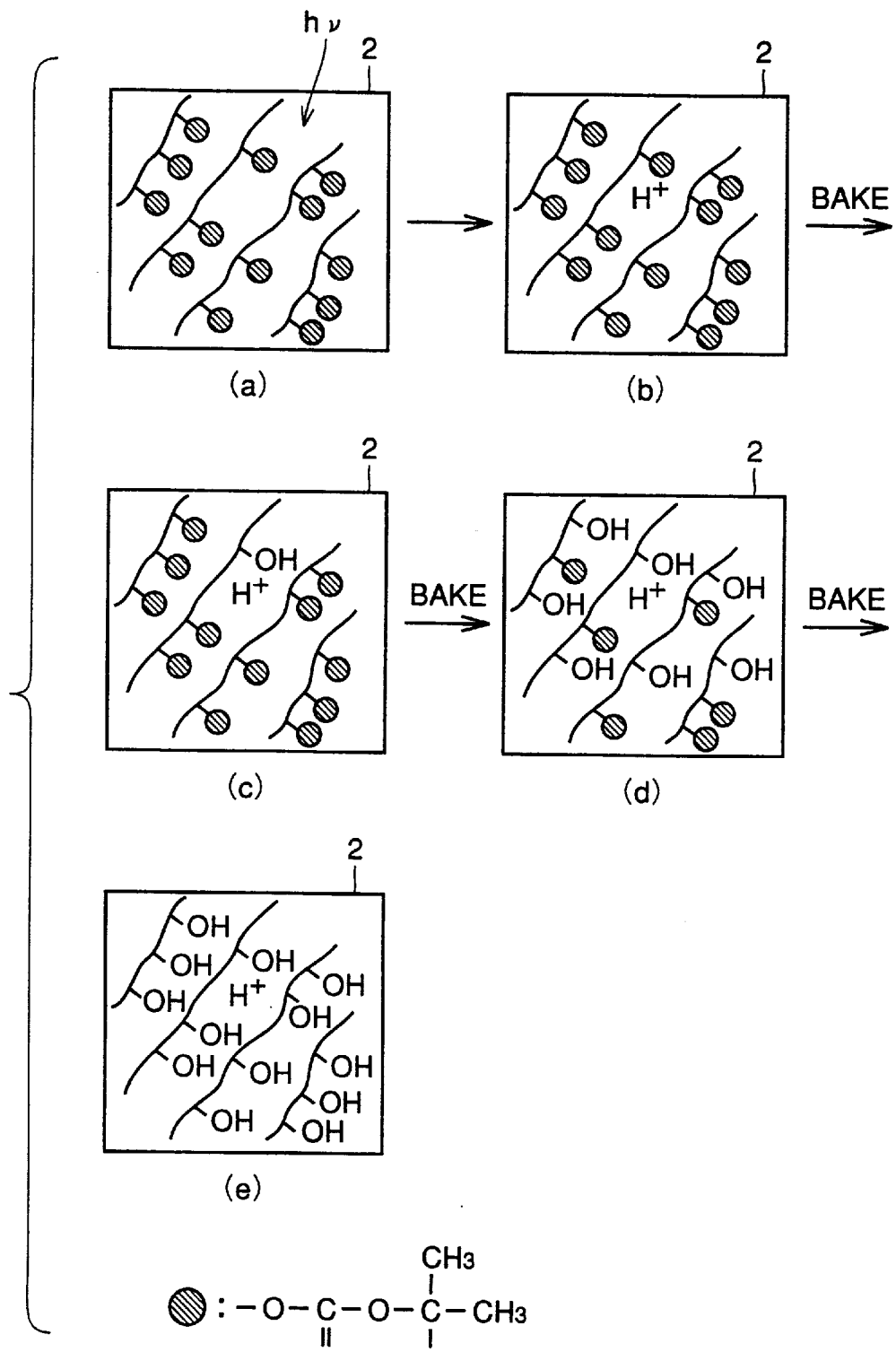
FIG. 22 is a schematic diagram illustrating the principle as to how the exposed portion becomes alkali-soluble.
Figure 23:
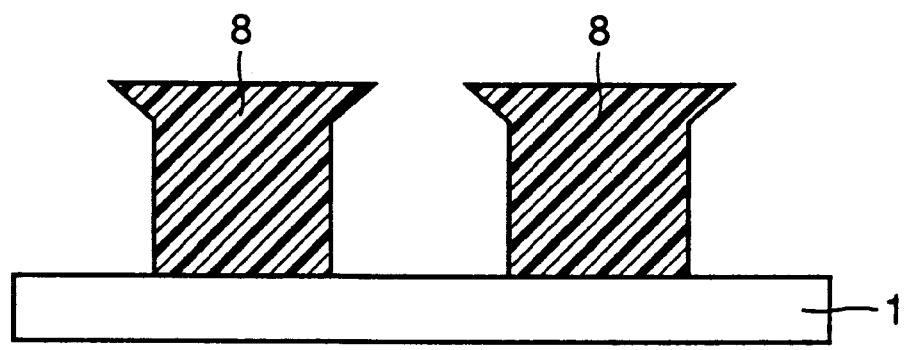
FIG. 23 is a diagram illustrating a problem arising with another conventional method of forming a resist pattern.

With reference to FIGS. 13 and 14, it is developed with the alkaline solution containing 2.38% TMAH for 60 seconds, and post-baked at 115° C. for 60 seconds. Accordingly, a desirable, rectangular resist pattern 8 of 0.22 μm L/S is obtained. The layer formed on the substrate 1 is etched using the resist pattern as a mask.

In the resist pattern forming method according to the third embodiment, acid film 3 is removed prior to PEB. The unexposed portion is thus no longer provided with acid at PEB, and therefore, a resist can be obtained with its inherent, ideal rectangular shape.

The present embodiment has been described to employ a positive type, chemically amplified-type resist. However, the same effects can be obtained using a negative type, chemically amplified-type resist.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a resist pattern, comprising the steps of:

forming a chemically amplified-type resist on a substrate;

exposing said resist using a mask;

after said exposure, baking said resist at a first temperature before development;

partially developing said resist;

baking said resist partially developed at a second temperature lower than said first temperature; and fully developing said resist to obtain a resist pattern.

2. The method according to claim 1, wherein said chemically amplified-type resist is a positive resist, and said developing is performed using an alkaline developer solution.

3. The method according to claim 1, wherein said first temperature is in a range between 30° C. and 150° C.

4. The method according to claim 1, wherein the difference between said first and second temperatures is set to be at least 10° C.

5. The method according to claim 1, wherein said partially developing said resist is performed until said resist at the exposed portion is removed by 10% to 80%.

6. The method according to claim 1, further comprising the step of forming an acid film on said chemically amplified-type resist prior to said exposure.

7. The method according to claim 1, wherein said resist pattern is for forming an interconnection pattern of 0.20–0.22 μm L/S.

8. The method according to claim 1, wherein said partially developing said resist develops said resist halfway.

9. A method of forming a resist pattern, comprising the steps of in the following order:

forming a chemically amplified-type resist on a substrate;

forming an acid film on said resist;

exposing said resist using a mask;

removing said acid film with water;

baking said resist before development; and developing said resist.

10. The method according to claim 9, wherein said step of removing said acid film includes the step of supplying said acid film with pure water while rotating said substrate.

11. The method according to claim 9, wherein said acid film includes a film made of water-soluble polymer.

12. A method of forming a semiconductor device, comprising the steps of:

forming a layer to be patterned on a substrate;

forming a chemically amplified-type resist on said layer;

exposing said resist using a mask;

after said exposure, baking said resist at a first temperature before development;

partially developing said resist;

baking said resist partially developed at a second temperature lower than said first temperature;

fully developing said resist to obtain a resist pattern; and etching said layer using said resist pattern as a mask.

13. The method according to claim 12, wherein said chemically amplified-type resist is a positive resist, and said developing is performed using alkaline developer solution.

14. The method according to claim 12, wherein said first temperature is in a range between 30° C. and 150° C.

15. The method according to claim 12, wherein said difference between said first and second temperature is set to be at least 10° C.

16. The method according to claim 12, wherein said partially developing said resist is performed until said resist at the exposed portion is removed by 10% to 80%.

17. The method according to claim 12, further comprising the step of forming an acid film on said chemically amplified-type resist prior to said exposure.

18. The method according to claim 12, wherein said resist pattern is for forming an interconnection pattern of 0.20–0.22 $\mu$mL/S.

19. The method according to claim 12, wherein said partially developing said resist develops said resist halfway.

20. A method of forming a semiconductor device, comprising the steps of in the following order:

forming a layer to be patterned on a substrate;

forming a chemically amplified-type resist on said substrate;

forming an acid film on said resist;

exposing said resist using a mask;

removing said acid film with water;

baking said resist before development;

developing said resist to obtain a resist pattern; etching said layer using said resist pattern as a mask.

21. The method according to claim 20, wherein said step of removing said acid film includes the step of supplying said acid film with pure water while rotating said substrate.

22. The method according to claim 20, wherein said acid film includes a film made of water-soluble polymer.

23. The method according to claim 11, wherein said water-soluble polymer includes polyvinylpyrrolidone.

24. The method according to claim 11, wherein said water-soluble polymer includes polyacrylic acid.

25. The method according to claim 22, wherein said water-soluble polymer includes polyvinylpyrrolidone.

26. The method according to claim 22, wherein said water-soluble polymer includes polyacrylic acid.

* * * * *